US009793922B2

United States Patent
Mateescu et al.

(10) Patent No.: US 9,793,922 B2
(45) Date of Patent: Oct. 17, 2017

(54) REPAIR-OPTIMAL PARITY CODE

(71) Applicant: HGST Netherlands B.V., Amsterdam (NL)

(72) Inventors: Robert Mateescu, San Jose, CA (US); Lluis Pamies-Juarez, San Jose, CA (US); Cyril Guyot, San Jose, CA (US)

(73) Assignee: HGST Netherlands B.V., Amsterdam (NL)

( * ) Notice: Subject to any disclaimer, the term of this patent is extended or adjusted under 35 U.S.C. 154(b) by 63 days.

(21) Appl. No.: 14/865,388

(22) Filed: Sep. 25, 2015

(65) Prior Publication Data
US 2017/0093425 A1    Mar. 30, 2017

(51) Int. Cl.
*H03M 13/11* (2006.01)
*G06F 11/10* (2006.01)
*H03M 13/37* (2006.01)

(52) U.S. Cl.
CPC ......... *H03M 13/11* (2013.01); *G06F 11/1076* (2013.01); *H03M 13/3761* (2013.01)

(58) Field of Classification Search
CPC ..... G06F 11/1076; G06F 11/10; H03M 13/11; H03M 13/3761; H03M 13/29; H03M 13/2921
See application file for complete search history.

(56) References Cited

U.S. PATENT DOCUMENTS

| 8,977,893 | B2 * | 3/2015 | Samanta | G06F 11/1092 714/6.24 |
|---|---|---|---|---|
| 2014/0019755 | A1 * | 1/2014 | Gerstner | G06F 12/1408 713/165 |
| 2016/0350186 | A1 * | 12/2016 | Blaum | H03M 13/154 |

* cited by examiner

*Primary Examiner* — Shelly A Chase
(74) *Attorney, Agent, or Firm* — Patent Law Works LLP

(57) ABSTRACT

Techniques for generating parities and repairing data erasures using repair-optimal parities are disclosed. The system includes an encoding module, which receives a request to recreate data for a subset of a plurality of content stores. The encoding module generates a new first parity and a new second parity using a subset of remaining content from the plurality of content stores. The encoding module generates a first portion of the requested data using the new first parity and a first subset of an original first parity for the plurality of content stores and a second portion of the requested data using the new second parity and a second subset of an original second parity for the plurality of content stores. The encoding module may recreate the data for the content store using the first portion of the requested data and the second portion of requested data.

18 Claims, 15 Drawing Sheets

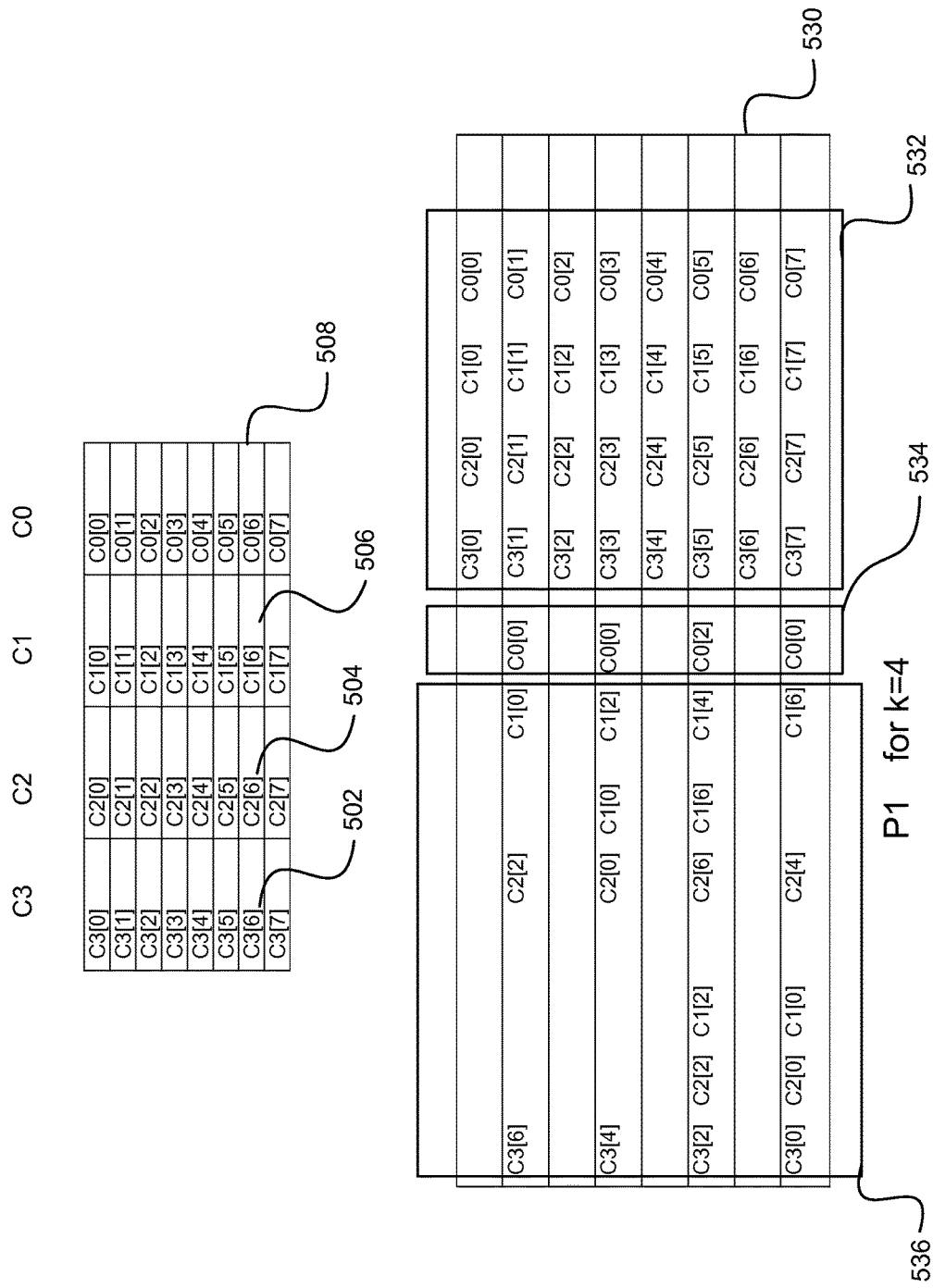

P2 for k=4

| | | | |
|---|---|---|---|
| C3[7] | C2[3] | C1[1] | C0[0] |
| C3[6] | C2[2] | C1[0] C0[0] | C0[1] |
| C3[5] | C2[1] C1[1] C0[1] | C1[3] | C0[2] |
| C3[4] | C2[0] C1[0] C0[0] | C1[2] | C0[3] |
| C3[3] C2[3] C1[3] C0[3] | | C1[7] | C0[4] |
| C3[2] C2[2] C1[2] C0[2] | | C1[6] | C0[5] |
| C3[1] C2[1] C1[1] C0[1] | | C1[5] | C0[6] |
| C3[0] C2[0] C1[0] C0[0] | | C1[6] | C0[7] |

540 ─ 542 ─ 544

| | |
|---|---|
| C3[6] C2[2] | C1[0] C0[0] |
| C3[4] C2[0] | C1[2] C0[0] |
| C3[6] C2[2] | C1[0] C0[0] |

REPAIR-OPTIMAL PARITY CODE

BACKGROUND

The present disclosure relates to repair-optimal parities for data recovery. In particular, the present disclosure relates to parities generated using a repair-optimal MDS code with optimal packetization.

Various algorithms are available for creating parity information for large amounts of data. Previous encoding techniques have shown that a large amount of data may be required to recreate lost data using parity information. Thus, there is a need for a parity code such that repairs from failure of any single storage device may be made using less of the remaining data.

SUMMARY

The present disclosure relates to systems and methods for repair-optimal parities for data recovery.

According to one innovative aspect, the subject matter described in this disclosure may be embodied in computer-implemented methods that include retrieving content from memory; generating a first part of a first parity of the content from memory, the first part including a horizontal parity of the content from memory; updating the first parity of the content from memory with a second part, the second part including each even row contribution of a first orthogonal permutation based on the content from memory; updating the first parity of the content from memory with a third part, the third part including a second orthogonal permutation based on a subset of the content from memory; generating a first part of a second parity of the content stored to memory, the first part including a third orthogonal permutation based on the content from memory; and updating the second parity of the content stored to memory with a subset of content from the second part of the first parity and the third part of the first parity, the subset of the content selected from even rows of the first parity.

Other implementations of one or more of these aspects include corresponding systems, apparatus, and computer programs, configured to perform the actions of the methods, encoded on computer storage devices. It should be understood that the language used in the present disclosure has been principally selected for readability and instructional purposes, and not to limit the scope of the subject matter disclosed herein.

BRIEF DESCRIPTION OF THE DRAWINGS

The present disclosure is illustrated by way of example, and not by way of limitation in the figures of the accompanying drawings in which like reference numerals are used to refer to similar elements.

FIGS. 5C and 5D depict a block diagram illustrating contents of four content stores, a first parity, and a second parity for the four content stores, according to the techniques described herein.

FIGS. 8A and 8B depict block diagrams illustrating an example of recreating data for a content store, according to the techniques described herein.

DETAILED DESCRIPTION

Systems and methods for generating for repair-optimal parities for data recovery are described below. While the systems and methods of the present disclosure are described in the context of a particular system architecture, it should be understood that the systems and methods can be applied to other architectures and organizations of hardware.

Figure 1:
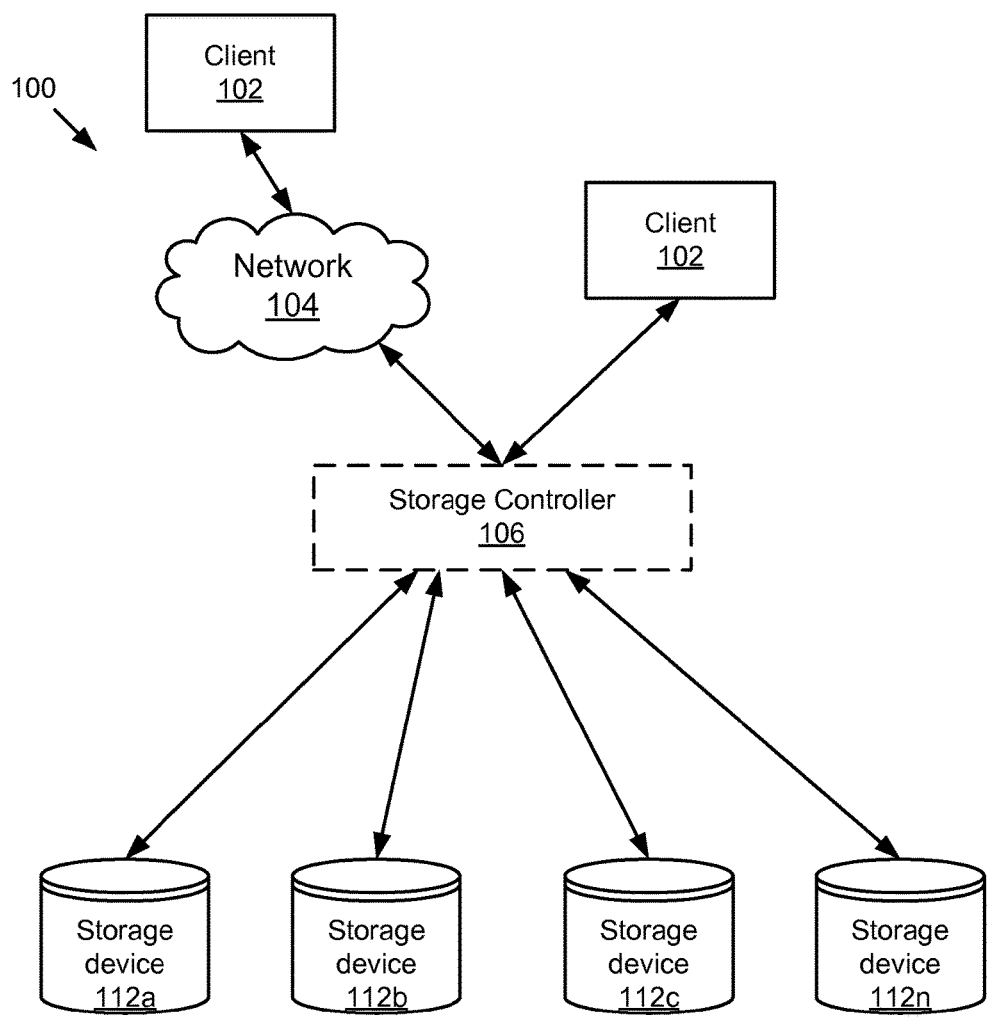
FIG. 1 is a high-level block diagram illustrating an example system including a storage system having multiple storage devices and a storage controller.

FIG. 1 is a high-level block diagram illustrating an example system 100 including a storage system having multiple storage devices 112 and a storage controller 106. The system 100 includes clients 102a . . . 102n, a network 104, and a storage system including storage devices 112a . . . 112n. In some embodiments, the system 100 may optionally include a storage controller 106.

The client devices 102a . . . 102n can be any computing device including one or more memory and one or more processors, for example, a laptop computer, a desktop computer, a tablet computer, a mobile telephone, a personal digital assistant (PDA), a mobile email device, a portable game player, a portable music player, a television with one or more processors embedded therein or coupled thereto or any other electronic device capable of making storage requests. A client device 102 may execute an application that makes storage requests (e.g., read, write, etc.) to the storage devices 112. While the example of FIG. 1 includes two clients, 102a and 102n, it should be understood that any number of clients 102 may be present in the system. Clients may be directly coupled with storage sub-systems including individual storage devices (e.g., storage device 112a) or storage systems behind a separate controller.

In some embodiments, the system 100 includes a storage controller 106 that provides a single interface for the client devices 102 to access the storage devices 112 in the storage system. In various embodiments, the storage devices may be directly connected with the storage controller 106 (e.g., storage device 112a) or may be connected through a separate controller. The storage controller 106 may be a computing device configured to make some or all of the storage space on disks 112 available to clients 102. As depicted in the example system 100, client devices can be coupled to the storage controller 106 via network 104 (e.g., client 102a) or directly (e.g., client 102n).

The network 104 can be a conventional type, wired or wireless, and may have numerous different configurations including a star configuration, token ring configuration, or other configurations. Furthermore, the network 104 may include a local area network (LAN), a wide area network (WAN) (e.g., the internet), and/or other interconnected data paths across which multiple devices (e.g., storage controller 106, client device 112, etc.) may communicate. In some embodiments, the network 104 may be a peer-to-peer network. The network 104 may also be coupled with or include portions of a telecommunications network for sending data using a variety of different communication protocols. In some embodiments, the network 104 may include Bluetooth (or Bluetooth low energy) communication networks or a cellular communications network for sending and receiving data including via short messaging service (SMS), multimedia messaging service (MMS), hypertext transfer protocol (HTTP), direct data connection, WAP, email, etc. Although the example of FIG. 1 illustrates one network 104, in practice one or more networks 104 can connect the entities of the system 100.

Figure 2:
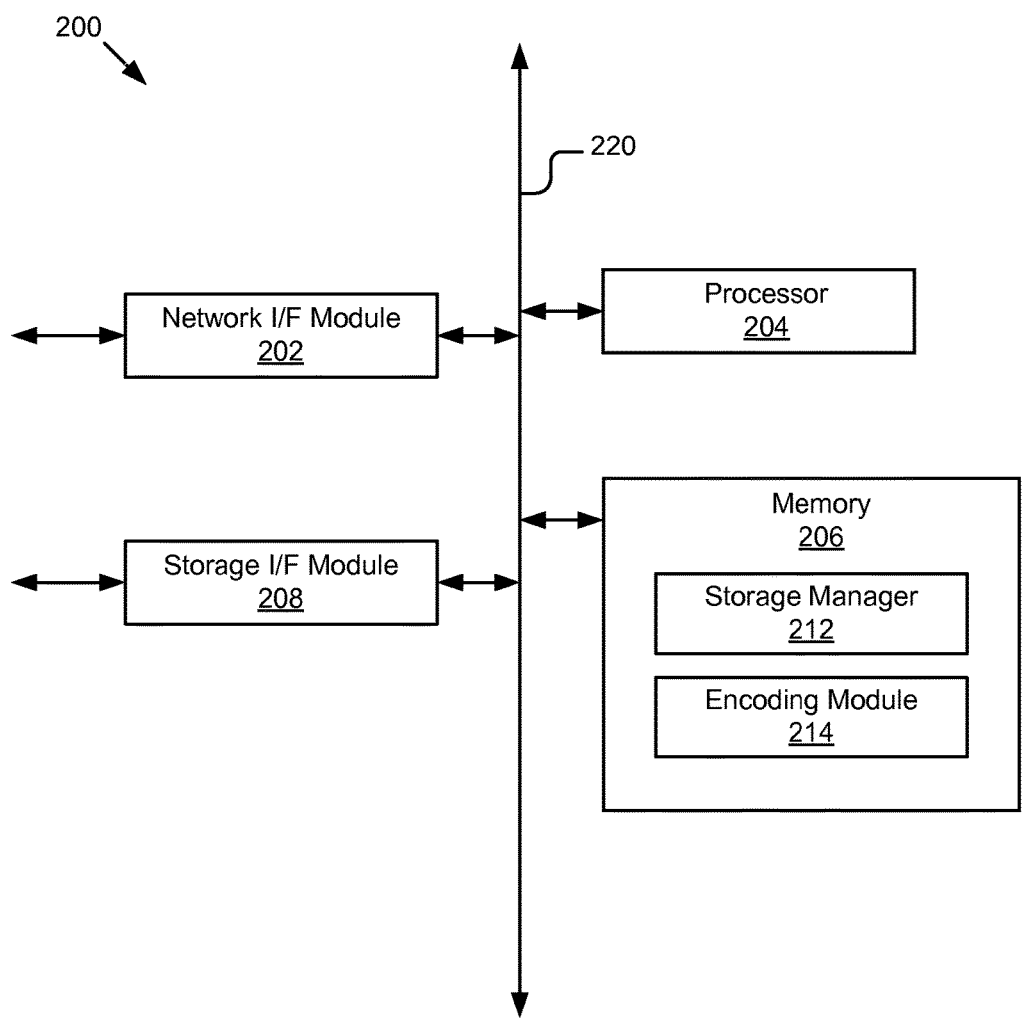
FIG. 2 is a block diagram illustrating an example system for use as a storage controller configured to implement techniques introduced herein.

FIG. 2 is a block diagram illustrating an example system 200 for use as a storage controller. In one embodiment, the system 200 may be a client device 102. In other embodiments, the system 200 may be storage controller 106. In the example of FIG. 2, the system 200 includes a network interface (I/F) module 202, a processor 204, a memory 206, and a storage interface (I/F) module 208. The components of the system 200 are communicatively coupled to a bus or software communication mechanism 220 for communication with each other.

The network interface module 202 is configured to connect system 200 to a network and/or other system (e.g., network 104). For example, network interface module 202 may enable communication through one or more of the internet, cable networks, and wired networks. The network interface module 202 links the processor 204 to the network 104 that may in turn be coupled to other processing systems. The network interface module 202 also provides other conventional connections to the network 104 for distribution and/or retrieval of files and/or media objects using standard network protocols such as TCP/IP, HTTP, HTTPS, and SMTP as will be understood. In some implementations, the network interface module 202 includes a transceiver for sending and receiving signals using Wi-Fi, Bluetooth®, or cellular communications for wireless communication.

The processor 204 may include an arithmetic logic unit, a microprocessor, a general purpose controller or some other processor array to perform computations and provide electronic display signals to a display device. In some implementations, the processor 204 is a hardware processor having one or more processing cores. The processor 204 is coupled to the bus 220 for communication with the other components. Processor 204 processes data signals and may include various computing architectures including a complex instruction set computer (CISC) architecture, a reduced instruction set computer (RISC) architecture, or an architecture implementing a combination of instruction sets. Although only a single processor is shown in the example of FIG. 2, multiple processors and/or processing cores may be included. It should be understood that other processor configurations are possible.

The memory 206 stores instructions and/or data that may be executed by the processor 204. In the illustrated implementation, the memory 206 includes a storage manager 210 and an encoding module 214. Although depicted as distinct modules in the example of FIG. 2, the storage manager 210 may include the encoding module 214 or perform the functions of the encoding module as described herein. The memory 206 is coupled to the bus 220 for communication with the other components of the system 200. The instructions and/or data stored in the memory 206 may include code for performing any and/or all of the techniques described herein. The memory 206 may be, for example, non-transitory memory such as a dynamic random access memory (DRAM) device, a static random access memory (SRAM) device, flash memory, or some other memory devices. In some implementations, the memory 206 also includes a non-volatile memory or similar permanent storage device and media, for example, a hard disk drive, a floppy disk drive, a compact disc read only memory (CD-ROM) device, a digital versatile disc read only memory (DVD-ROM) device, a digital versatile disc random access memories (DVD-RAM) device, a digital versatile disc rewritable (DVD-RW) device, a flash memory device, or some other non-volatile storage device.

Software communication mechanism 220 may be an object bus (e.g., CORBA), direct socket communication (e.g., TCP/IP sockets) among software modules, remote procedure calls, UDP broadcasts and receipts, HTTP connections, function or procedure calls, etc. Further, any or all of the communication could be secure (SSH, HTTPS, etc.). The software communication mechanism 220 can be implemented on any underlying hardware, for example, a network, the Internet, a bus, a combination thereof, etc.

The storage I/F module 208 cooperates with the storage manager 210 to access information requested by the client 102. The information may be stored on any type of attached array of writable storage media, such as magnetic disk or tape, optical disk (e.g., CD-ROM or DVD), flash memory, solid-state drive (SSD), electronic random access memory (RAM), micro-electro mechanical and/or any other similar media adapted to store information, including data and parity information. However, as illustratively described herein, the information is stored on disks 112. The storage I/F module 208 includes a plurality of ports having input/output (I/O) interface circuitry that couples with the disks over an I/O interconnect arrangement.

The storage manager 212, stored on memory 206 and configured to be executed by processor 204, facilitates access to data stored on the disks 112. In certain embodiments, the storage manager 212 logically organizes data as a hierarchical structure of named directories and files on the disks 112. The storage manager 212 cooperates with the encoding module 214 to encode data stored on the disks for recovery in the event of a failure of one or more disks. The storage manager, in some embodiments, may detect a failure of a disk and cooperate with the encoding module 214 to recreate the data stored on the failed disk.

Encoding module 214 may be stored in memory 206 and executed by processor 204. The encoding module 214 is configured to encode parity data for a plurality of content stores. In one embodiment, to generate the parity data, the encoding module 214 encodes content stored to storage devices 112 to generate two parities of the content stored to storage devices 112. In one embodiment, the first parity of the content stored to the storage devices 112 has three parts. The first part of the first parity of the content stored to the storage devices may be a horizontal parity. For example, assuming the content is stored across four content stores (e.g., storage devices 112), the first data element of each content store is combined to create the first part of the first data element of the first parity. In one embodiment, the first data element of each content store is combined using an "exclusive or" (XOR) operation to create the first part of the first data element of the first parity. The second part of the first parity of the content stored to the storage devices may include a contribution of a content store for each even row of a first orthogonal permutation based on the content from the content stores. The third part of the first parity may include a second orthogonal permutation based on a subset of the content from the content stores.

In one embodiment, to create a first part of a second parity, the encoding module 214 may generate an orthogonal permutation of a first subset of the content stored to storage devices 112 and an orthogonal permutation of a second subset of content from the storage devices 112 in an inverse orientation to the orthogonal permutation of the first subset of content. For example, the encoding module 214 retrieves a first subset of content from memory and generates an orthogonal permutation of the first subset of content. In some embodiments, the encoding module 214 adds a correcting factor to the orthogonal permutation of the first subset of content. The encoding module 214 may then retrieve a second subset of content from memory and generates an orthogonal permutation of the second subset of content in an inverse orientation to the orthogonal permutation of the first subset of content. The encoding module 214 may, in some embodiments, add a correcting factor to the orthogonal permutation of the second subset of content. Thus, the encoding module 214 encodes content stored to the storage devices 112 using a recursive orthogonal permutation of the content, the correcting factors, to generate the first part of the second parity. A second part of the second parity, may be generated using a subset of content from the second part of the first parity and the third part of the first parity. In one embodiment, the second subset of content is selected from the even rows of the first parity.

In some embodiments, the encoding module 214 is configured to recreate lost content that was stored to a content store. In some embodiments, the encoding module 214 may recreate lost data on one or more disks by accessing only half of the remaining content in the content stores. To recreate the lost content, the encoding module 214 may generate a new first parity and a new second parity for the remaining content using the techniques described herein. The new first parity and the new second parity can be compared to original parities to recreate the lost content. The comparison may include computing an XOR operation on the new first parity and the first parity for the content stored to the plurality of content stores to generate a first portion of the lost content and a an XOR operation on the new second parity and the second parity for the content stored to the plurality of content stores to generate a second portion of the lost content.

In some embodiments, the encoding module 214 is configured to recreate lost content for a parity of a plurality of content stores. In some embodiments, the encoding module 214 may repair failure of a parity of the plurality of content stores by accessing half of the remaining content. To repair the failure of the parity, the encoding module 214 may retrieve a first subset of content from the plurality of content stores and a second subset of content from a remaining parity for the plurality of content stores. The encoding module 214, may be configured to recreate the lost data for the second parity using the first subset of content from the plurality of content stores and the second subset of content from the remaining parity for the plurality of content stores. In one embodiment, the encoding module 214 may compute an XOR operation on the first subset of content from the plurality of content stores and the second subset of content from the remaining parity for the plurality of content stores to repair failure of the parity.

Figure 3:
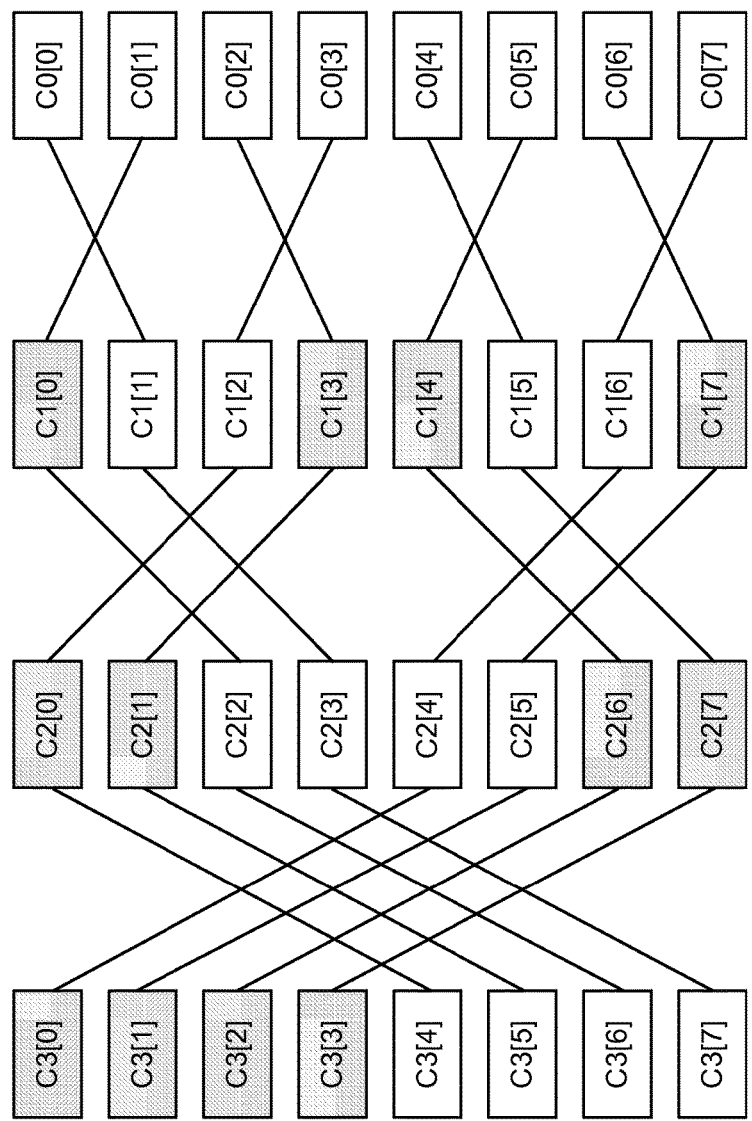
FIG. 3 is a block diagram illustrating a construction for generating a repair-optimal parity for content stored across four content stores, according to the techniques described herein.

FIG. 3 is a block diagram illustrating a construction for generating a portion of a repair-optimal parity for content stored across four content stores. In the example construction shown in FIG. 3, each of the content stores contains eight data elements. In general, for k content stores, the number of elements in each content store is $2^{k-1}$. The information element in column i and row j is denoted as $Ci[j]$. There are two parity nodes created for the content stored across the four content stores. The second parity is encoded according to the lines in FIG. 3. For each $P2[i]$, the parity is encoded using the line corresponding to element $C0[i]$. For example, the first element of the second parity $P2[0]$ is encoded according to the line that starts at element $C0[0]$.

The element $P2[i]$ is encoded as the parity of data elements in the line corresponding to data element $C0[i]$. In addition, if there are shaded elements in the line, a correcting factor is added to $P2[i]$. In one embodiment, for each shaded element in the line, the correcting factor includes all elements depicted to the right of the shaded element in the example construction of FIG. 3. For example, for the second element in the second parity ($P2[1]=C0[1]+C1[0]+C2[2]+C3[6]+C0[0]$), the elements $C0[1]$, $C1[0]$, $C2[2]$ and $C3[6]$ form the parity element using the construction in FIG. 3. Additionally, since $C1[0]$ is shaded, the element to the right of $C1[0]$ ($C0[0]$) is also added to the parity element.

The shaded elements in FIG. 3 are those $Ci[j]$, for which the ith bit in the binary representation of j over k−1 bits is equal to i−1th bit, where, if the i−1th bit is −1, the −1th bit is considered as 0, and k is the total number of content stores. In the example of FIG. 3, where k=4 and in the case of $C1[3]$, the binary representation of j over k−1 bits is 011 (i.e., j=3 and k−1=3). Continuing with the example of $C1[3]$, where i=1, the ith bit is the 1st bit and the i−1th bit is the 0th bit. In the binary representation 011, the 0th bit is 1, the 1st bit is 1 and the 2nd bit is 0. Thus, since the ith bit is equal to the i−1th bit (i.e., the 1st bit and the 0th bit are both 1), the element is shaded and a correcting factor is added to the second parity along with the element $C1[3]$. The first parity and the second parity are described below in more detail with reference to FIGS. 4, 5A, and 5B.

Figure 4:
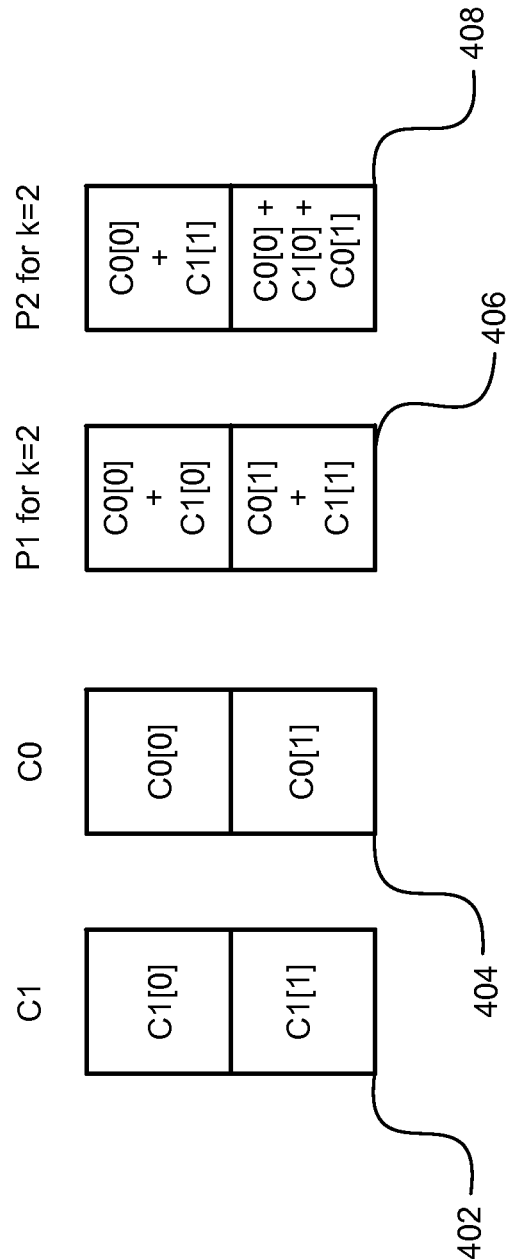
FIG. 4 is a block diagram illustrating contents of two content stores, a first parity, and a second parity for the two content stores, according to a butterfly code.

FIG. 4 is a block diagram illustrating contents of two content stores, a first parity, and a second parity for the two content stores, according to a butterfly code. In the example of FIG. 4, the second parity for the two content stores are generated using an orthogonal permutation as shown above in FIG. 3. In the example of FIG. 4, the content stores 402 and 404 are referred to as C1 and C0, respectively below. The first parity 406 is referred to below as P1 and the second parity 408 is referred to below as P2. In this example, the first data element (e.g., bit, byte, block, or the like) stored to content store C0 is $C0[0]$, the first data element stored to content store C1 is $C1[0]$, the second data element stored to content store C0 is $C0[1]$, and the second data element stored to content store C1 is $C1[1]$. While depicted in the example of FIG. 4 as distinct content stores, it should be understood that one or more of the content stores may be stored on the same hardware or various hardware devices.

In one embodiment, to generate the first parity 406 of this example, a combinatorial circuit may be used to "XOR" all of the corresponding bits stored to content stores C0 and C1. For example, the first data element of the first parity 406 is a horizontal parity of the first data elements of content stores 402 and 404. As shown in the example of FIG. 4, the first data element of the first parity 406 is represented by C0[0]+ C1[0] in the first row, which is calculated by XOR-ing C0[0] from the first row of C0 and C1[0] from the first row of C1. In some embodiments, the second parity P2 may be generated using an orthogonal permutation of the content from the content stores C0 and C1 and a correcting factor.

Figure 5A:
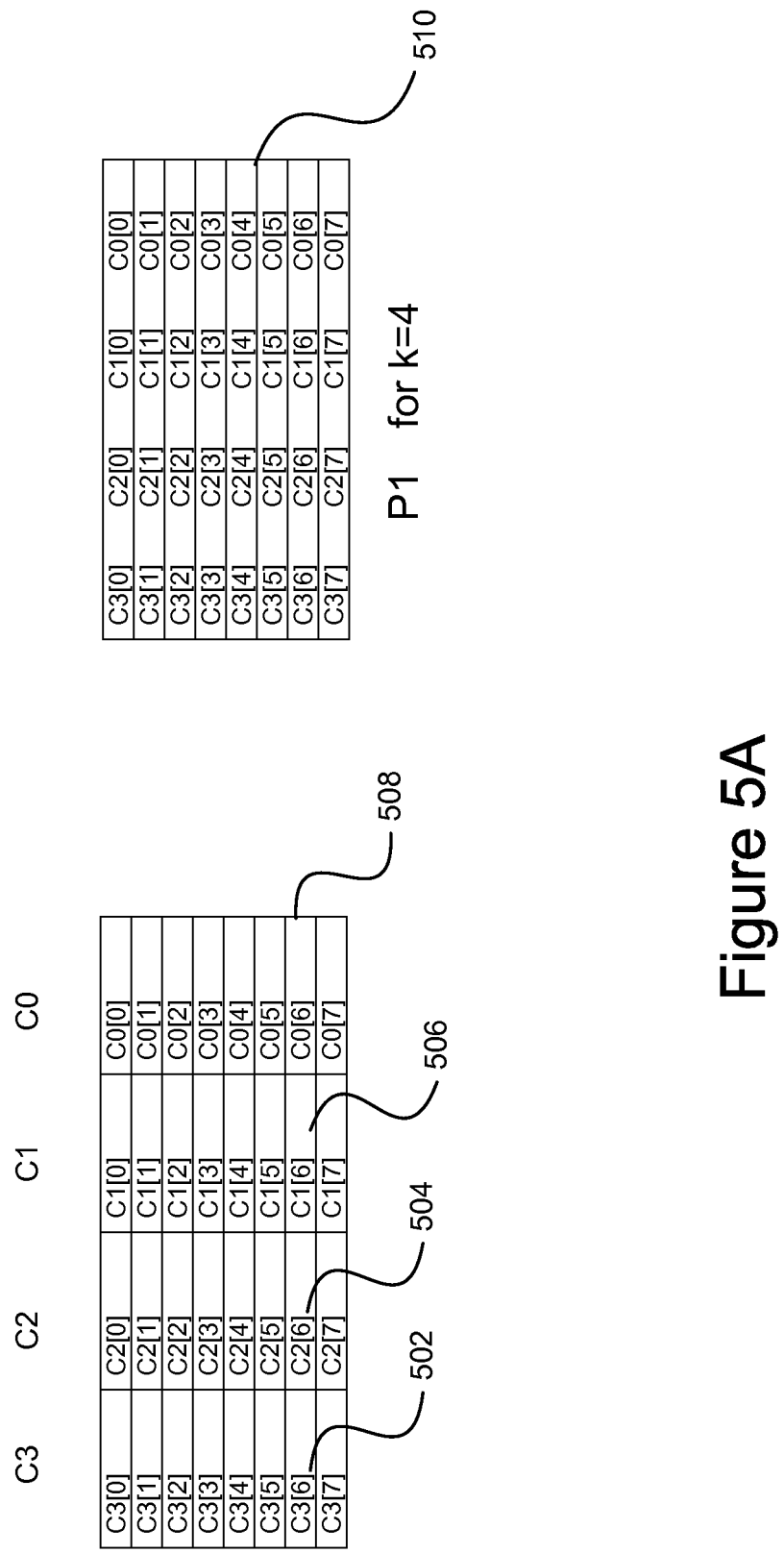
FIGS. 5A and 5B depict block diagrams illustrating contents of four content stores, a first parity, and a second parity for the four content stores, according to a butterfly code.
Figure 5B:
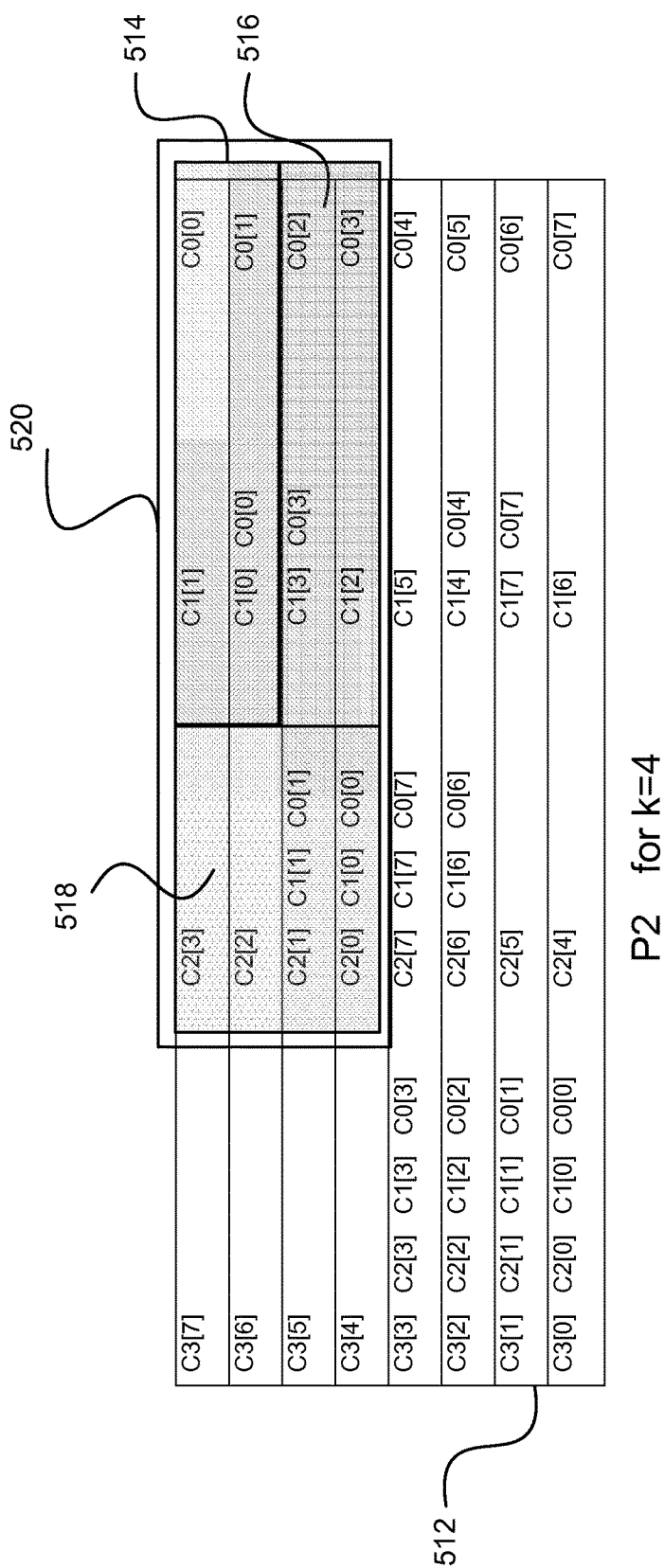

FIGS. 5A and 5B depict a block diagram illustrating contents of four content stores, a first parity, and a second parity for the four content stores. In the example of FIGS. 5A and 5B, the first parity and the second parity are generated according to a butterfly code construction. Butterfly code is a 2-parity maximum distance separable (MDS) erasure code over GF(2) with an efficient recovery ratio. The butterfly code has a code rate of k/k+2, where k is the number of systematic nodes or contents stores in the system. The butterfly code has an additional property that allows for recovery from failure of one content store using only half of the remaining data.

In the example of FIG. 5A, the content stores 502-508 are referred to as C0, C1, C2, and C3, respectively, and the first parity 504 is referred to as P1. As described above, the first parity 510 may be calculated as a horizontal parity of the data elements in the content stores 502-508. For example, the first data element of P1 includes C0[0], C1[0], C2[0] and C3[0] which is calculated by the XOR combination of the first data element of each content store. While depicted in the example of FIGS. 5A and 5B as distinct content stores and parities, it should be understood that one or more of the content stores and the parities may be stored on the same hardware or various hardware devices.

The parities for butterfly code may be generated in a recursive manner. For example, the encoding module 214 encodes the first two data elements stored to content stores C0 and C1 to generate a first portion 514 of the second parity 512. The first portion 514 is a butterfly code for k=2 (e.g., for two data stores). In one embodiment, the encoding module may calculate the first portion 514 using techniques described above with reference to FIG. 3. The encoding module may then generate a second portion 520 of the second parity 512. The second portion 520 of the second parity 512 is a second parity for k=3, generated using butterfly code and includes the first portion 514 including a first orthogonal permutation and a correcting factor, a second portion 516 including a second orthogonal permutation in an inverse orientation to the first and a correcting factor, and a portion 518 including the data from the content store C2 and a correcting factor. Thus, the construction of the second parity 512 may be broken down into recursively smaller constructions of two k−1 construction and correcting factors.

FIGS. 5C and 5D depict a block diagram illustrating contents of four content stores, a first parity, and a second parity for the four content stores. In the example of FIGS. 5A and 5B, the first parity and the second parity are generated according to a repair-optimal monarch code construction. Monarch code is a repair optimal (k+2, k) maximum distance separable (MDS) code for all nodes, including the first and second parities. The monarch code has the property of the butterfly code that allows for recovery from any two systematic node failures. Further, the monarch code allows for recovery from failure of one content store using only half of the remaining data. The monarch code has an additional property that allows for recovery from failure of any parity using only half of the remaining data.

In the example of FIG. 5C, the content stores 502-508 are referred to as C0, C1, C2, and C3, respectively, and the first parity 530 is referred to as P1. As described above, the first parity 530 using monarch code may be calculated in three parts. The first part 532 of the first parity is a horizontal parity of the data elements in the content stores 502-508. For example, the first part of the first data element of P1 includes C0[0], C1[0], C2[0] and C3[0] which is calculated by the XOR combination of the first data element of each content store, as described with reference to FIG. 5A. The second part 534 of the first parity P1 is an even row contribution of an orthogonal permutation of the content from the content stores. In the example of FIG. 5C, the first orthogonal permutation is the butterfly code described with reference to FIGS. 5A and 5B. For example, the elements of the second part 534 of the first parity 530 is the even row contribution of the content store C0 in an orthogonal permutation of the content from the content stores. The encoding module 214, updates the first parity with a third part 536. In the example of FIG. 5C, the third part 536 of the first parity P1 includes elements generated by an orthogonal permutation over even rows of content stores C1, C2, and C3. In the example of FIG. 5C, the third part 536 of the first parity 530 includes all elements of content stores C1, C2 and C3 from the even rows of the second parity 512 generated using the butterfly code, described with reference to FIG. 5B.

The second parity 540 using monarch code may be generated in two parts. For example, the encoding module 214 encodes the data elements stored to content stores C0, C1, C2 and C3 in a manner such that the first part 542 of the second parity 540 is a butterfly code of the content stores C0-C3 without elements from content store C0 in the lower right triangle. In one embodiment, the encoding module 214 may generate a subset of the first part of the second parity using techniques described with reference to FIG. 5B. For example, while generating the first part of the second parity, the encoding module 214 omits the contribution of the content store C0 in the correcting factor of the orthogonal permutation in an inverse orientation. With reference to FIG. 5B, the orthogonal permutation in an inverse orientation for k=2 is 516. The encoding module 214 next, updates the second parity 540 with a second part 544. The second part 544 of the second parity 540 is selected from the even rows of the second part 534 and the third part 536 of the first parity 530. For example, the second part of the second parity 540 includes $2^i$th row elements from the second and third part of the first parity for each i, where i=1 . . . k−2, and a reflection of all elements before the $2^i$th row for all values of i. In the example of FIG. 5D, the third row of the second part 544 of the second parity 540 is the $2^1$th row of the second part 534 and the third part 536 of the first parity 530. In this case, there is no element before the $2^1$th row. The fifth row of the second part 544 of the second parity 540 is the $2^2$th row of the second part 534 and the third part 536 of the first parity 530. The reflection of the $2^2$th row of the second and third part of the first parity 530 is the $2^1$th row. Thus, the seventh row of the second part 544 of the second parity 540 is the reflection of the $2^2$th row of the second and third part of the first parity 530. In this example, since the value of k is 4, the values of i will be 1 and 2. While depicted in the example of FIGS. 5C and 5D as distinct content stores and parities, it should be understood that one or more of the content stores and the parities may be stored on the same hardware or various hardware devices.

Figure 6:
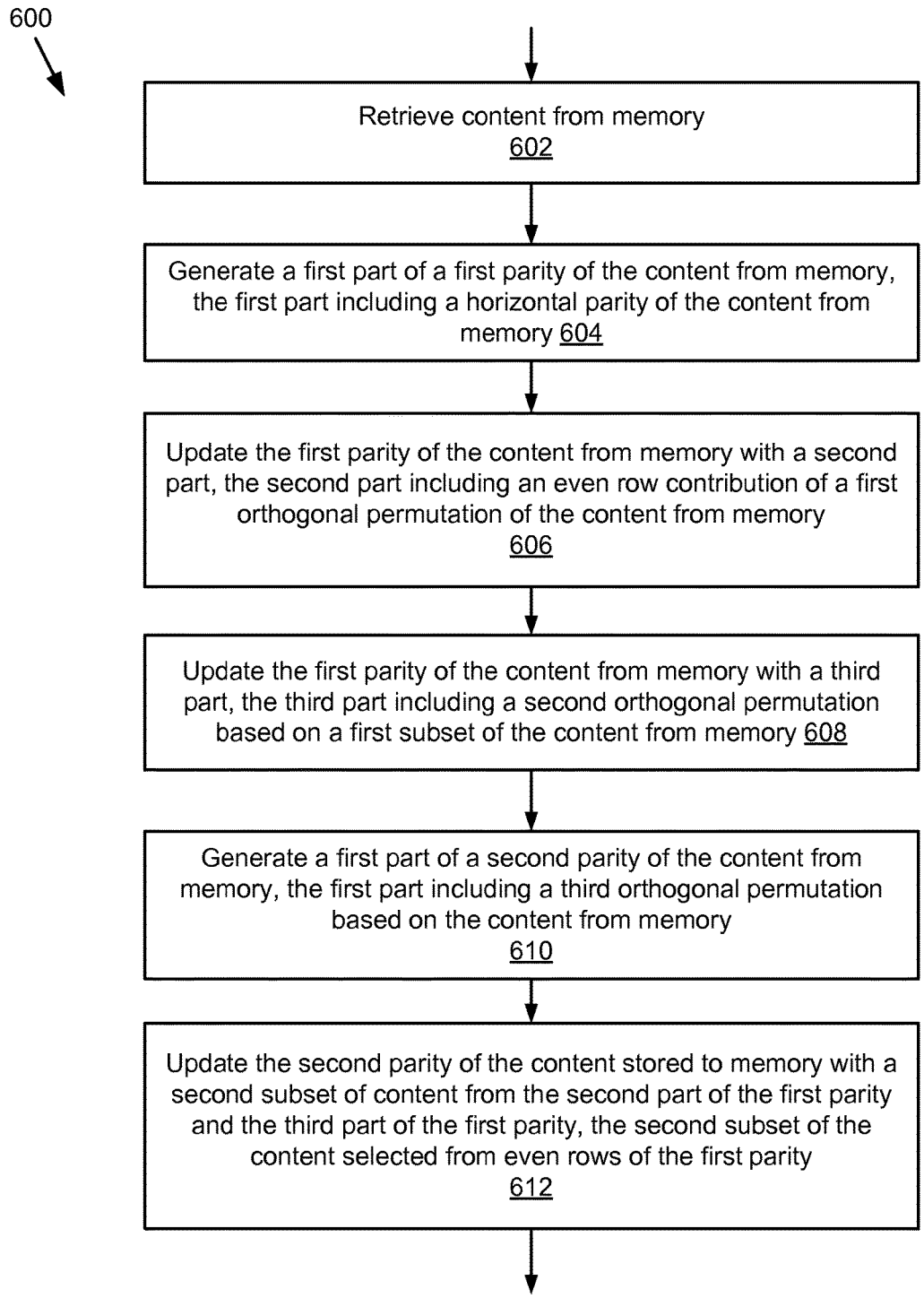
FIG. 6 is a flowchart of an example method for encoding content stored to a plurality of content stores to generate a first parity and a second parity, according to the techniques described herein.

FIG. 6 is a flowchart of an example method 600 for encoding data stored to a plurality of content stores to generate a first parity (e.g., P1 as shown in the example of FIG. 5C) and a second parity (e.g., P2 as shown in the example of FIG. 5D) using monarch code. At 602, the encoding module 214 retrieves content from memory. In one embodiment, the memory may be a primary memory, for example, non-transitory memory such as a dynamic random access memory (DRAM) device and a static random access memory (SRAM). In one embodiment, the memory may include systematic nodes residing on separate disks. In another embodiment, the memory may include content stores residing on the same disk. The encoding module 214 may retrieve the content in response to a request to encode data (e.g., when the memory includes a threshold amount of data). In some embodiments, the encoding module 214 may be configured to encode content as it is received from a client device 102 and stored to disk 112.

At 604, the encoding module 214 generates a first part of a first parity of the content from memory. The encoding module 214 calculates the first part of the first parity as a horizontal parity for the content from memory. For example, the first part of the first element of the first parity is calculated by performing an XOR operation on the first data element (e.g., bit, byte, block, etc.) of each content store from memory. As depicted in the example of FIG. 5C, the encoding module 214 calculates the first data element of the first part 532 of the first parity 530 by performing an XOR operation on the first data element of the first content store (C0[0]), the first data element of the second content store (C1[0]), the first data element of the third content store (C2[0]) and the first data element of the fourth content store (C3[0]). Similarly, the second data element of the first part 532 of the first parity 530 is calculated by performing an XOR operation on the second data element of the first content store (C0[1]), the second data element of the second content store (C1[1]), the second data element of the third content store (C2[1]) and the second data element of the fourth content store (C3[1]).

Returning to the example of FIG. 6, the encoding module 214 updates 606 the first parity of the content from memory with a second part, the second part including an even row contribution of a first orthogonal permutation of the content from memory. For example, the first orthogonal permutation may be generated using the butterfly construction described in FIG. 5B. As shown in the example of FIG. 5C, the even row contribution of the first content store is C0[0] for the second row, C0[0] for the fourth row, C0[2] for the sixth row and C0[0] for the eighth row.

Returning to FIG. 6, the encoding module 214 updates 608 the first parity of the content from memory with a third part, the third part including a second orthogonal permutation based on a first subset of the content from memory. In some embodiments, the first subset of content includes even rows of the plurality of content stores without the first content store. The second orthogonal permutation may be a butterfly construction over the even rows of content stores C1, C2 and C3, generated using techniques described in FIG. 5B.

The encoding module 214, generates 610 a first part of a second parity of the content from memory, the first part including a third orthogonal permutation based on the content from memory. For example, the encoding module 214 generates the first part of the second parity using the butterfly code described in FIG. 5B. In some embodiments, the third orthogonal permutation does not include data elements from the first content store (C0) in the correcting factor of the orthogonal permutation in an inverse orientation, while generating the second parity using techniques described in FIG. 5B.

The encoding module 214 updates 612 the second parity of the content from memory with a second subset of content. In one embodiment, the second subset of content is selected from the even rows of second part of the first parity and the third part of the first parity. In the example of FIGS. 5C and 5D, the second part 544 of the second parity 540 includes $2^i$th row elements from the second part 534 and third part 536 of the first parity 530 for each i, where i=1 ... k−2, and a reflection of all elements before the $2^i$th row for all values of i.

The encoding module may write the first parity on a first content store (e.g., storage device 112) and the second parity on a second content store (e.g., storage device 112). Although the examples of FIGS. 3, 4 and 5 show parities determined for a code word where k=4, the repair optimal parities may be generated for any value of k.

Figure 7:
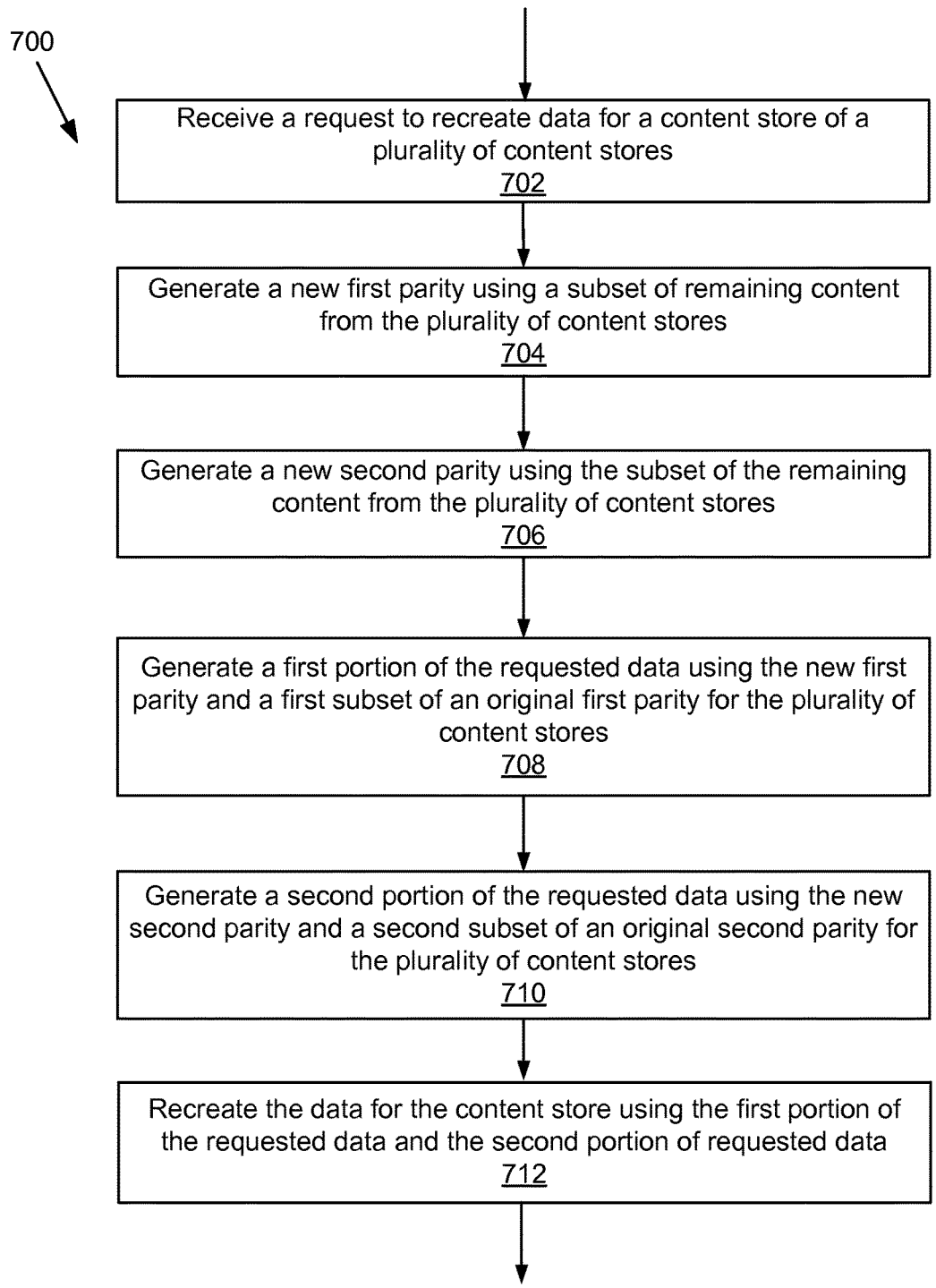
FIG. 7 is a flowchart of an example method for recreating data for a content store from a plurality of content stores including a parity, according to the techniques described herein.

FIG. 7 is a flowchart of an example method for recreating data for a content store from a plurality of content stores including a parity. At 702, the encoding module 214 receives a request to recreate data for a content store of a plurality of content stores. In one embodiment, the request may be a failure notification of a particular content store. The encoding module 214 may retrieve a subset of the content from the remaining content stores in response to a request to recreate data. In another embodiment, the encoding module may receive a request to recreate data for more than one content store. At 704, the encoding module 214 generates a new first parity using a subset of remaining content from the plurality of content stores. The new first parity may be calculated using methods described with reference to FIGS. 5 and 6. The subset of remaining content may be selected based on the failed content store. In some embodiments, the subset of remaining content may be pre-determined for failure of a particular content store. For example, the subset of content may be half of the rows of the remaining content stores for failure of any one content store.

At 706, the encoding module 214 generates a new second parity using the subset of the remaining content from the plurality of content stores using the construction described above with reference to FIGS. 5 and 6. At 708, the encoding module 214 generates a first portion of the requested data using the new first parity and a first subset of an original first parity for the plurality of content stores. In some embodiments, the original first parity for the plurality of content stores was encoded when the data was stored to the plurality of content stores. In one embodiment, the encoding module 214 compares the new first parity with half of the original first parity for the plurality of content stores to determine the first portion of the requested data. For example, the encoding module determines the first portion of the requested data using an XOR operation on the new first parity and a subset of data elements from the original first parity for the plurality of content stores. At 710, the encoding module 214 generates a second portion of the requested data using the new second parity and a second subset of an original second parity for the plurality of content stores. In some embodiments, the encoding module 214 may compare the new second parity with half of the original second parity for the plurality of content stores. For example, in order to recreate lost data for two content stores, the comparison will result in data elements from the new first parity and the new second parity, some including more than one element of lost data. At 712, the encoding module 214 recreates the data for the content store using the first portion of the requested data and the second portion of requested data. For example, the lost data for two content stores may be obtained by linear clearing. In one embodiment, the lost data may be obtained by another XOR operation between the first portion of requested data and the second portion of the requested data. The method for recreating data for a content store is depicted in the example data shown in FIGS. 8A and 8B.

Figure 8A:
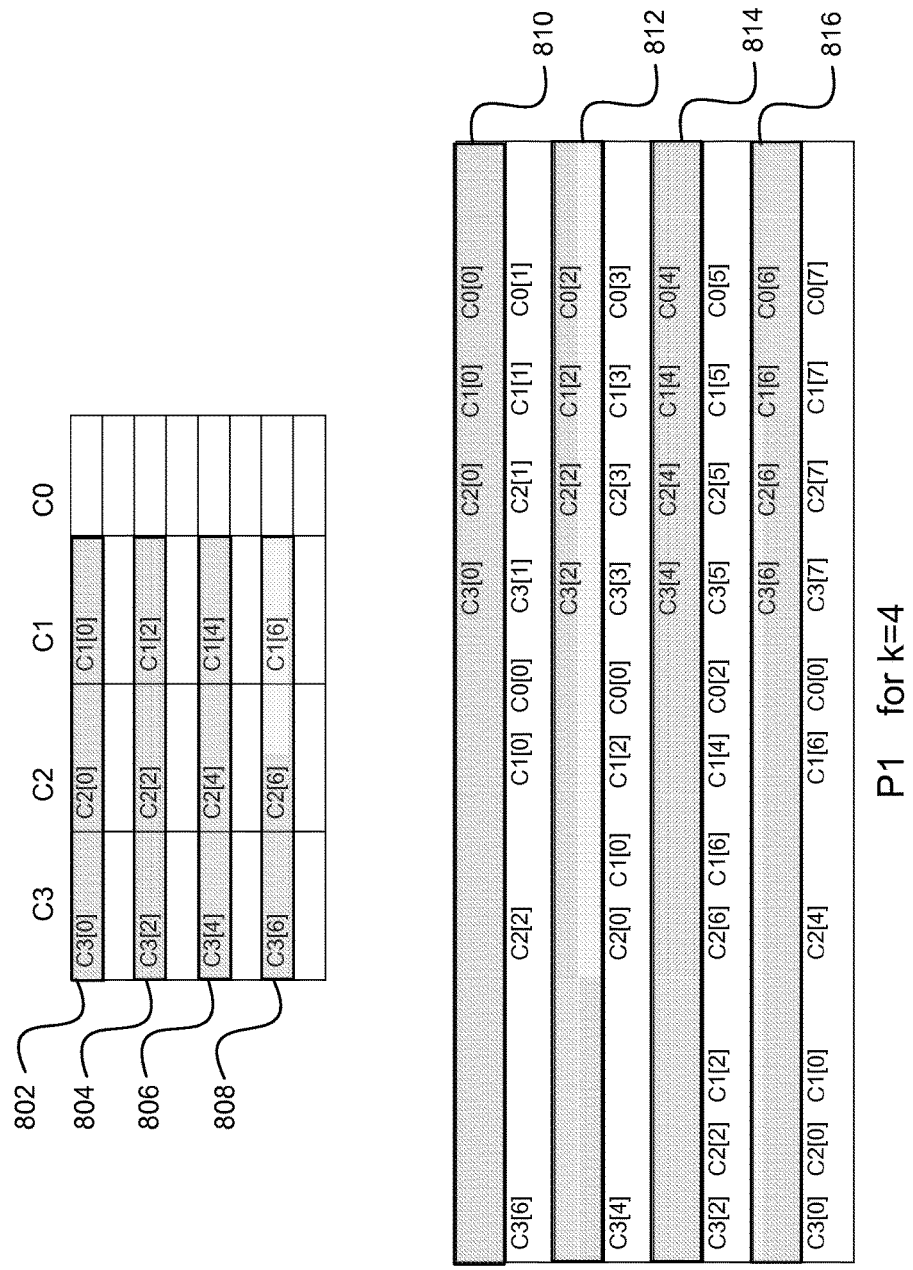
Figure 8B:
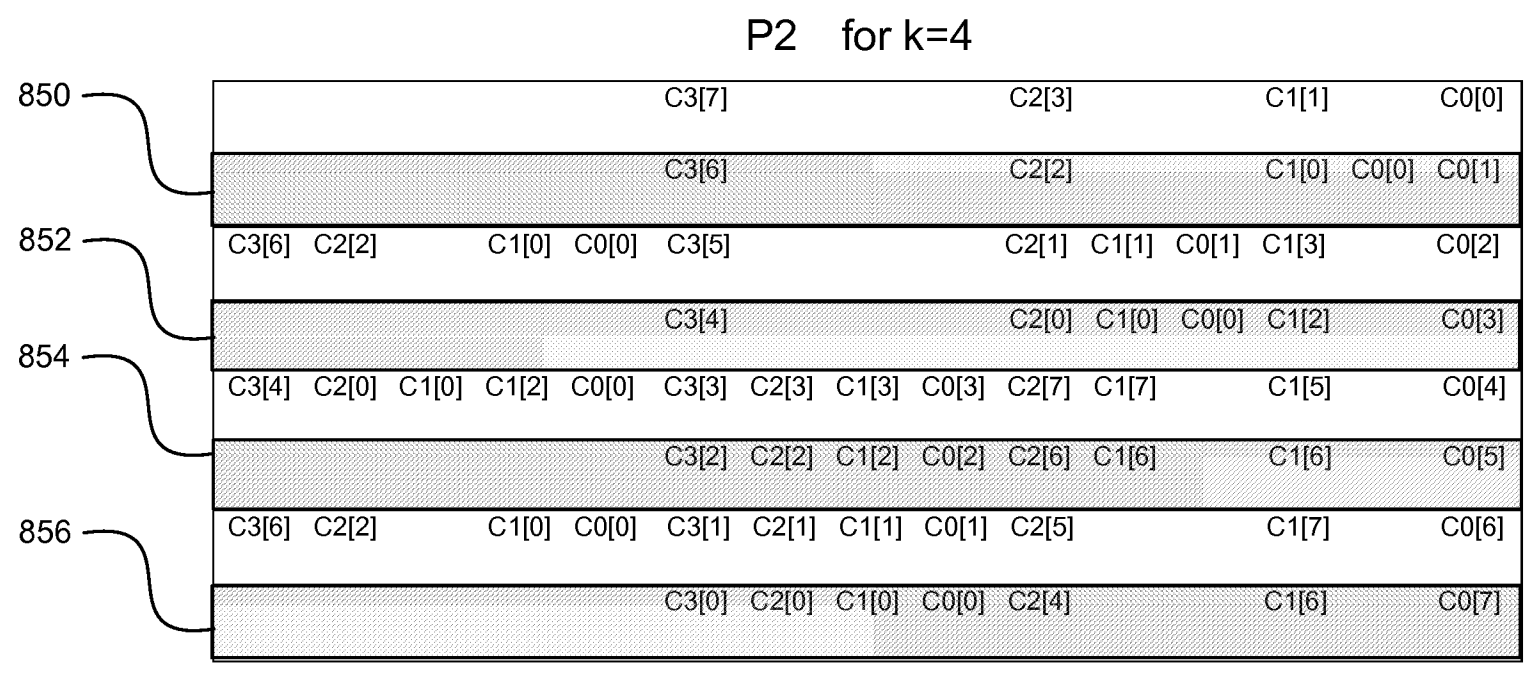

FIGS. 8A and 8B depict a block diagram illustrating an example of recreating data for a content store. In the example of FIGS. 8A and 8B, the data stored on content store C0 is lost, for example through a disk failure or the like. For one failure recovery, the present invention uses half of the remaining data elements (e.g., half of the original content stored to the content stores, half of the content stored to the original first parity, half of the content stored to the original second parity) to recreate the lost content store. In the example of FIG. 8A, where content store C0 is lost, a subset of the remaining data used to recreate C0 is the first row 802 of the remaining content stores, the third row 804 of the remaining content stores, the fifth row 806 of the remaining content stores and the seventh row 808 of the remaining content stores. In order to recreate lost data for content store C0, the encoding module 214, generates a new first parity and a new second parity with the subset of the remaining data using techniques described herein with reference to FIGS. 3-6. The encoding module 214 then compares the new first parity with a subset of an original first parity for the plurality of content stores (e.g., the subset of the original first parity described above with respect to FIG. 8A is the first row 810 of the original first parity, the third row 812 of the original first parity, the fifth row 814 of the original first parity and the seventh row 816 of the original first parity) to determine a first portion of the lost data.

The encoding module 214 may also compare the new second parity with a subset of the original second parity for the plurality of content stores (e.g., the second parity P2 described with reference to FIG. 5B) to determine a second portion of the lost data. As shown in the example of FIGS. 8A and 8B, the encoding module 214 generates the new second parity by using the first row 802 of the remaining content stores, the third row 804 of the remaining content stores, the fifth row 806 of the remaining content stores and the seventh row 808 of the remaining content stores. The encoding module 214, then compares the new second parity with a subset of the second parity described in FIG. 8B (e.g., the subset of the original second parity described above with respect to FIG. 8B is the second row 850 of the original second parity, the fourth row 852 of the original second parity, the sixth row 854 of the original second parity and the eighth row 856 of the original second parity). The encoding module 214 may then recreate the data for the content store C0 using the first comparison results and the second comparison results. The encoding module 214 may then return the result to be recreated on a new content store.

Figure 9:
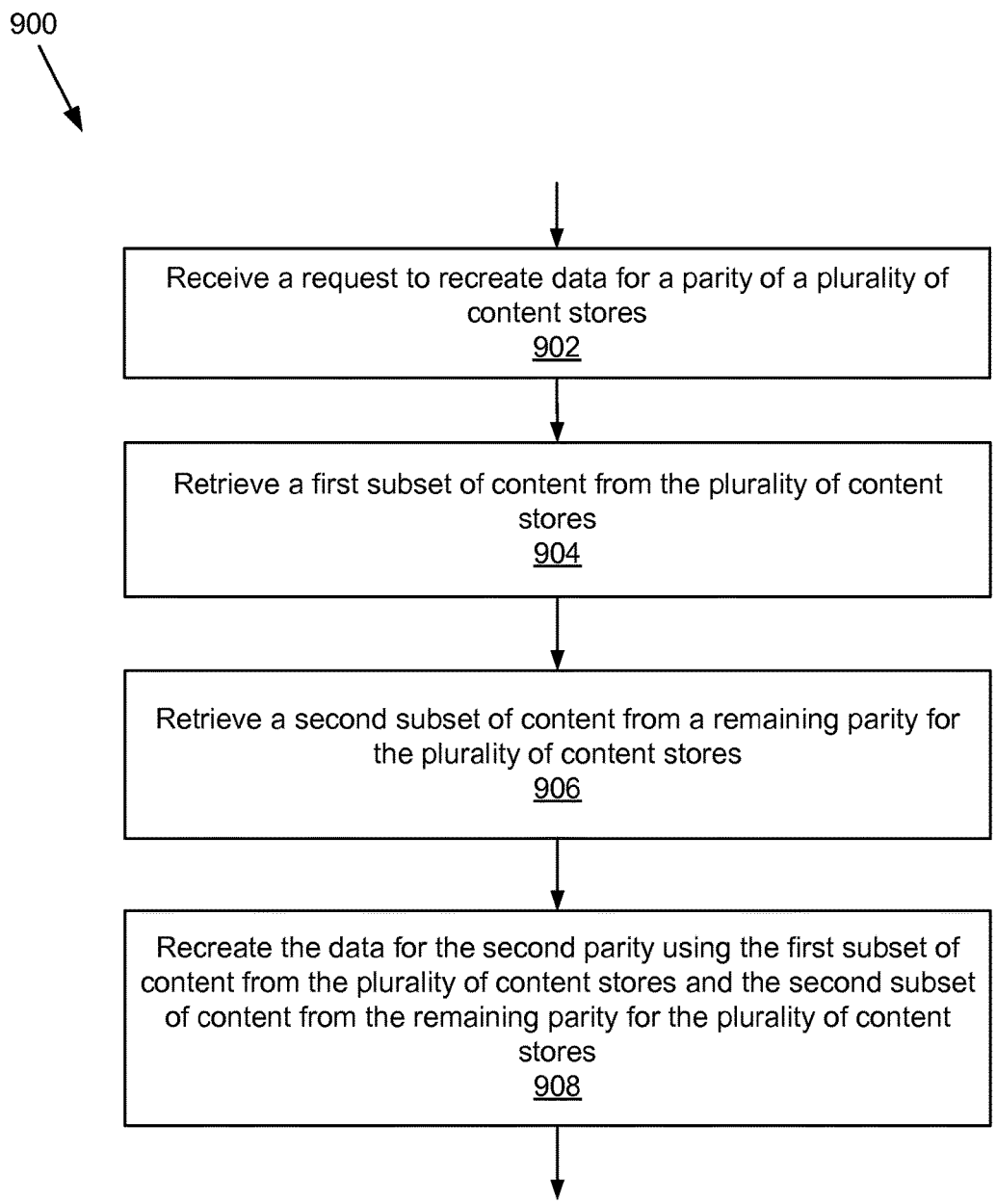
FIG. 9 is a flowchart of an example method for recreating data for a second parity of a plurality of content stores, according to the techniques described herein.

FIG. 9 is a flowchart of an example method for recreating data for a parity of a plurality of content stores. At 902, the encoding module 214 receives a request to recreate data for a parity of a plurality of content stores. In one embodiment, the request may be a failure notification of the second parity of the plurality of content stores. At 904, the encoding module 214 retrieves a first subset of content from the plurality of content stores. The first subset of content may be half of the rows of the plurality of content stores. In some embodiments, the first subset of content may be pre-determined for failure of the parity.

At 906, the encoding module 214 retrieves a second subset of content from a remaining parity for the plurality of content stores. In some embodiments, the remaining parity is a first parity for the plurality of content stores, which was encoded when the data was stored to the plurality of content stores. In one embodiment, the encoding module 214 retrieves half of the remaining parity for the plurality of content stores. At 908, the encoding module 214 recreates the data for the second parity using the first subset of content from the plurality of content stores and the second subset of content from the remaining parity for the plurality of content stores. In some embodiments, the lost data for two content stores may be obtained by using techniques described with reference to FIG. 3-6. The method for recreating data for a content store is depicted in the example data shown in FIGS. 10A and 10B.

Figure 10A:
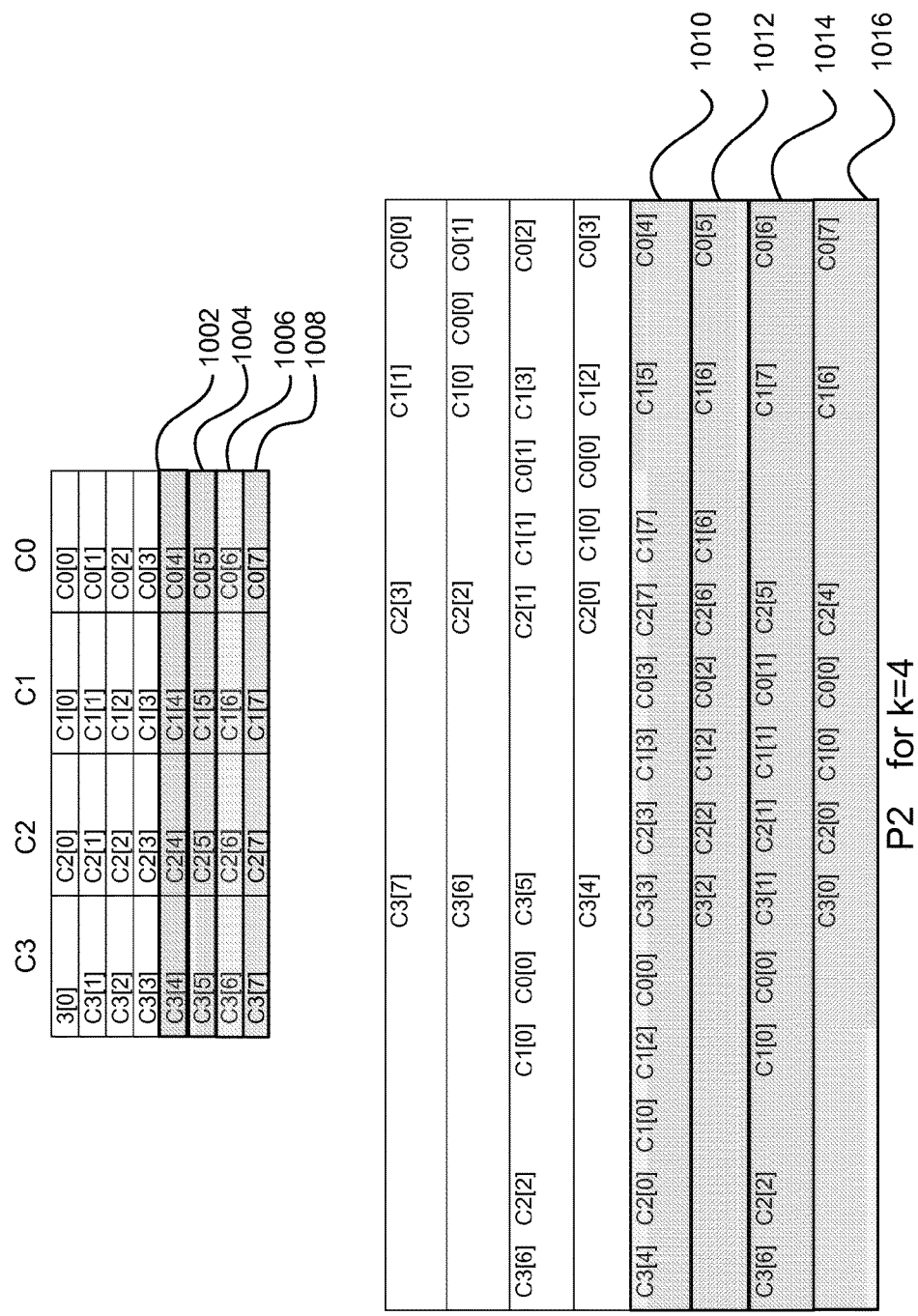
FIG. 10A depicts block diagram illustrating an example of recreating data for a first parity of a plurality of content stores, according to the techniques described herein.

FIG. 10A depicts a block diagram illustrating an example of recreating data for a first parity of a plurality of content stores. In the example of FIG. 10A, the data elements of a first parity are lost, for example through a disk failure or the like. For the failure recovery of the first parity, the present invention uses half of the remaining data elements (e.g., half of the original content stored to the content stores and half of the content stored to the second parity of the plurality of content stores) to recreate the lost first parity. In the example of FIG. 10A, in order to recreate lost data for the first parity, the encoding module 214, retrieves the fifth row 1002 of the content stores (C0[4], C1[4], C2[4], C3[4]), the sixth row 1004 of the content stores (C0[5], C1[5], C2[5], C3[5]), the seventh row 1006 of the content stores (C0[6], C1[6], C2[6], C3[6]) and the eighth row 1008 of the content stores (C0[7], C1[7], C2[7], C3[7]). The encoding module 214 also retrieves the fifth row 1010 of the second parity of the plurality of content stores, the sixth row 1012 of the second parity of the plurality of content stores, the seventh row 1014 of the second parity of the plurality of content stores and the eighth row 1016 of the second parity of the plurality of content stores. The encoding module 214 generates the lost first parity by using the retrieved portions from the content stores and the retrieved portion from the second parity of the plurality of content stores. The encoding module 214 may generate the first parity using techniques described with reference to FIG. 3-6.

Figure 10B:
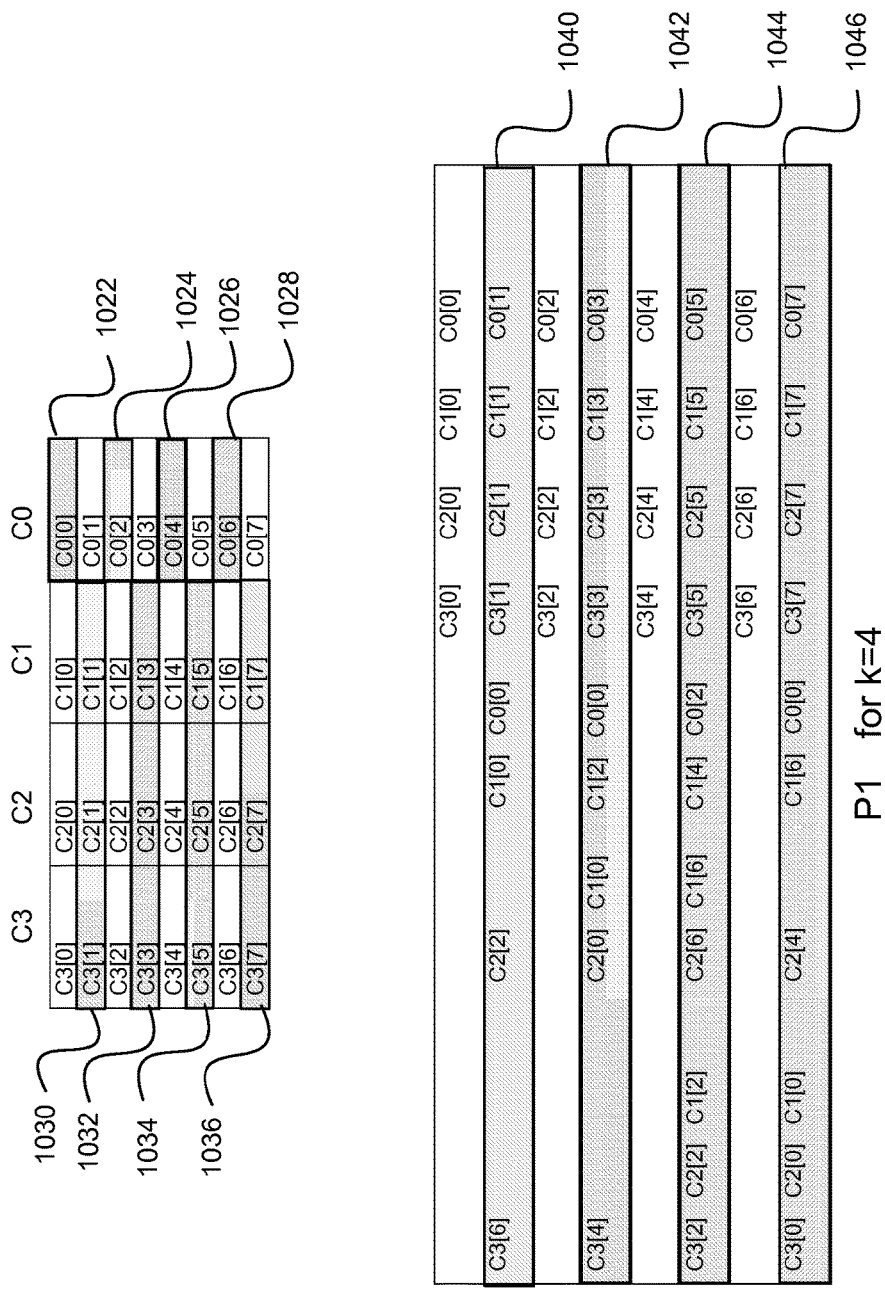
FIG. 10B depict block diagram illustrating an example of recreating data for a second parity of a plurality of content stores, according to the techniques described herein

FIG. 10B depict a block diagram illustrating an example of recreating data for a second parity of a plurality of content stores. In the example of FIG. 10, the data elements of a second parity are lost, for example through a disk failure or the like. For the failure recovery of the second parity, the present invention uses half of the remaining data elements (e.g., half of the original content stored to the content stores and half of the content stored to the original first parity) to recreate the lost second parity. In the example of FIG. 10B, in order to recreate lost data for the second parity, the encoding module 214, retrieves the first element 1022 of the first content store (C0[0]), the third element 1024 of the first content store (C0[2]), the fifth element 1026 of the first content store (C0[4]) and the seventh element 1028 of the first content store (C0[6]). The encoding module 214 also retrieves the second row 1030 of the remaining content stores (C1[1], C2[1], C3[1]), the fourth row 1032 of the remaining content stores (C1[3], C2[3], C3[3]), the sixth row 1034 of the remaining content stores (C1[5], C2[5], C3[5]) and the eighth row 1036 of the remaining content stores (C1[7], C2[7], C3[7]).

The encoding module 214 then retrieves the second row 1040 of the original first parity, the fourth row 1042 of the original first parity, the sixth row 1044 of the original first parity and the eighth row 1046 of the original first parity. The encoding module 214 generates the lost second parity by using the retrieved portions from the content stores and the retrieved portion from the original first parity. Finally, the encoding module 214 may return the result to be recreated on a new storage disk.

Systems and methods for generating repair-optimal parities for data recovery have been described. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to user interfaces and particular hardware. Moreover, the technologies disclosed above primarily in the context of on line services; however, the disclosed technologies apply to other data sources and other data types (e.g., collections of other resources for example images, audio, web pages).

Reference in the specification to "one implementation" or "an implementation" means that a particular feature, structure, or characteristic described in connection with the implementation is included in at least one implementation of the disclosed technologies. The appearances of the phrase "in one implementation" in various places in the specification are not necessarily all referring to the same implementation.

Some portions of the detailed descriptions above were presented in terms of processes and symbolic representations of operations on data bits within a computer memory. A process can generally be considered a self-consistent sequence of steps leading to a result. The steps may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory or any type of media suitable for storing electronic instructions, each coupled to a computer system bus.

The disclosed technologies can take the form of an entirely hardware implementation, an entirely software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems and Ethernet cards are just a few of the currently available types of network adapters.

Finally, the processes and displays presented herein may not be inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A computer-implemented method comprising:
retrieving content from memory;
generating a first part of a first parity of the content from memory, the first part including a horizontal parity of the content from memory;
updating the first parity of the content from memory with a second part, the second part including an even row contribution of a first orthogonal permutation of the content from memory;
updating the first parity of the content from memory with a third part, the third part including a second orthogonal permutation based on a first subset of the content from memory;
generating a first part of a second parity of the content from memory, the first part including a third orthogonal permutation based on the content from memory; and
updating the second parity of the content from memory with a second subset of content from the second part of the first parity and the third part of the first parity, the second subset of the content selected from even rows of the first parity.

2. The computer-implemented method of claim 1, further comprising:
determining that a code word is complete, wherein the content from memory includes the code word;
writing the first parity to a first content store; and
writing the second parity to a second content store.

3. The computer-implemented method of claim 1, further comprising receiving a request to recreate data for a content store of a plurality of content stores, wherein the plurality of content stores include the content from memory that is represented in the first parity and the second parity.

4. The computer-implemented method of claim 3, further comprising:
in response to receiving the request to recreate data for the content store of the plurality of content stores, comparing a new first parity for a subset of remaining content in the plurality of content stores and a new second parity for the subset of remaining content in the plurality of content stores with the first parity and the second parity, respectively; and
recreating the data for the content store based on the comparison.

5. The computer-implemented method of claim 4, wherein the comparison is:
an exclusive-or (XOR) operation on the new first parity and the first parity for the content; and
an XOR operation on the new second parity and the second parity for the content.

6. The computer-implemented method of claim 1, further comprising generating the first parity and the second parity in a recursive pattern, wherein the recursive pattern is based on the size of the content.

7. A system comprising:
a plurality of content stores; and
a storage controller including an encoding module configured to:
retrieve content from memory;
generate a first part of a first parity of the content from memory, the first part including a horizontal parity of the content from memory;
update the first parity of the content from memory with a second part, the second part including an even row contribution of a first orthogonal permutation of the content from memory;
update the first parity of the content from memory with a third part, the third part including a second orthogonal permutation based on a first subset of the content from memory;
generate a first part of a second parity of the content from memory, the first part including a third orthogonal permutation based on the content from memory; and
update the second parity of the content from memory with a second subset of content from the second part of the first parity and the third part of the first parity, the second subset of the content selected from even rows of the first parity.

8. The system of claim 7, wherein the encoding module is further configured to:
determine that a code word is complete, wherein the content from memory includes the code word;
write the first parity to a first content store; and
write the second parity to a second content store.

9. The system of claim 7, wherein the encoding module is further configured to receive a request to recreate data for a content store of the plurality of content stores, wherein the plurality of content stores include the content from memory that is represented in the first parity and the second parity.

10. The system of claim 9, wherein the encoding module is further configured to:
in response to receiving the request to recreate data for the content store of the plurality of content stores, compare a new first parity for a subset of remaining content in the plurality of content stores and a new second parity for the subset of remaining content in the plurality of content stores with the first parity and the second parity, respectively; and
recreate the data for the content store based on the comparison.

11. The system of claim 10, wherein the comparison is:
an exclusive-or (XOR) operation on the new first parity and the first parity for the content; and
an XOR operation on the new second parity and the second parity for the content.

12. The system of claim 7, wherein the encoding module is further configured to generate the first parity and the second parity in a recursive pattern, wherein the recursive pattern is based on the size of the content.

13. A system comprising:
means for retrieving content from memory;
means for generating a first part of a first parity of the content from memory, the first part including a horizontal parity of the content from memory;
means for updating the first parity of the content from memory with a second part, the second part including an even row contribution of a first orthogonal permutation of the content from memory;
means for updating the first parity of the content from memory with a third part, the third part including a second orthogonal permutation based on a first subset of the content from memory;

means for generating a first part of a second parity of the content from memory, the first part including a third orthogonal permutation based on the content from memory; and means for updating the second parity of the content from memory with a second subset of content from the second part of the first parity and the third part of the first parity, the second subset of the content selected from even rows of the first parity.

14. The system of claim 13, further comprising:

means for determining that a code word is complete, wherein the content from memory includes the code word;

means for writing the first parity to a first content store; and means for writing the second parity to a second content store.

15. The system of claim 13, further comprising means for receiving a request to recreate data for a content store of a plurality of content stores, wherein the plurality of content stores include the content from memory that is represented in the first parity and the second parity.

16. The system of claim 15, further comprising:

means for comparing, in response to receiving the request to recreate data for the content store of the plurality of content stores, a new first parity for a subset of remaining content in the plurality of content stores and a new second parity for the subset of remaining content in the plurality of content stores with the first parity and the second parity, respectively; and means for recreating the data for the content store based on the comparison.

17. The system of claim 16, wherein the comparison is:

an exclusive-or (XOR) operation on the new first parity and the first parity for the content; and an XOR operation on the new second parity and the second parity for the content.

18. The system of claim 13, further comprising means for generating the first parity and the second parity in a recursive pattern, wherein the recursive pattern is based on the size of the content.

* * * * *